United States Patent [19]

Kim et al.

[11] Patent Number: 5,170,245
[45] Date of Patent: Dec. 8, 1992

[54] SEMICONDUCTOR DEVICE HAVING METALLIC INTERCONNECTS FORMED BY GRIT BLASTING

[75] Inventors: Jungihl Kim, Peekskill; Joseph C. Logue, Poughkeepsie; John J. Ritsko, Mount Kisco; Robert R. Shaw, Poughkeepsie; George F. Walker, New York, all of N.Y.

[73] Assignee: International Business Machines Corp., Armonk, N.Y.

[21] Appl. No.: 653,978

[22] Filed: Feb. 11, 1991

Related U.S. Application Data

[60] Continuation of Ser. No. 422,605, Oct. 17, 1989, abandoned, which is a division of Ser. No. 207,085, Jun. 15, 1988, Pat. No. 4,896,464.

[51] Int. Cl.$^5$ .................. H01L 23/02; H01L 23/12; H01L 23/48; H01L 23/40
[52] U.S. Cl. .................. 174/260; 257/700
[58] Field of Search .................. 357/75, 74, 68, 80, 357/71, 72, 65

[56] References Cited

U.S. PATENT DOCUMENTS

| | | | |
|---|---|---|---|
| 2,861,911 | 11/1958 | Martin et al. . | |
| 2,984,597 | 5/1961 | Hennes . | |
| 3,225,495 | 12/1965 | De Vries . | |
| 3,375,181 | 3/1968 | Koech et al. . | |
| 3,509,624 | 5/1970 | Boucher . | |
| 3,555,364 | 1/1971 | Matcovich | 357/75 |
| 3,617,817 | 11/1971 | Kawakatsu | 357/75 |
| 3,888,054 | 6/1975 | Maselli . | |
| 4,020,535 | 5/1977 | Cuneo et al. . | |
| 4,047,286 | 9/1977 | Lob et al. . | |
| 4,082,394 | 4/1978 | Gedney et al. | 357/75 |
| 4,091,125 | 5/1978 | Delgadillo . | |
| 4,109,377 | 8/1978 | Blazick et al. . | |
| 4,159,222 | 6/1979 | Lebow et al. . | |
| 4,221,047 | 9/1980 | Narken et al. | 357/75 |
| 4,232,059 | 11/1980 | Proffitt . | |
| 4,389,771 | 6/1983 | Cassidy et al. . | |
| 4,575,396 | 3/1986 | Matsumoto et al. . | |
| 4,612,737 | 9/1986 | Addee et al. . | |
| 4,724,472 | 2/1988 | Sugimoto et al. | 357/74 |
| 4,727,410 | 2/1988 | Higgins, III | 357/74 |
| 4,733,503 | 3/1988 | Gallant et al. . | |
| 4,750,031 | 6/1988 | Miller et al. | 357/74 |
| 4,827,327 | 5/1989 | Miyaguchi et al. | 357/74 |
| 4,922,324 | 5/1990 | Sudo | 357/80 |

FOREIGN PATENT DOCUMENTS

| | | |
|---|---|---|
| 0002166 | 10/1978 | European Pat. Off. . |
| 61-147535 | 7/1986 | Japan . |
| WO88/08360 | 11/1988 | PCT Int'l Appl. . |
| 2005573A | 4/1975 | United Kingdom . |

*Primary Examiner*—Andrew J. James
*Assistant Examiner*—Carl Whitehead, Jr.
*Attorney, Agent, or Firm*—Perman & Green

[57] ABSTRACT

This invention relates to a ceramic module and to methods for forming protruding, upstanding electrically conducting pins by the selective abrasion of a surface 18 of a multilayered ceramic module 10. An abrasive blasting device 40 is disposed adjacent to the surface 18 for directing a stream of abrasive particles 42 against the surface. The particles 42 strike both metallic conductors 20 and 22 and also the ceramic material of the layer 14. Inasmuch as the ceramic material is relatively hard and brittle as compared to the ductile metallic conductors the abrasive particles 42 abrade away the ceramic layer 14 at a faster rate than the ductile metallic material of the conductors 20 and 22. The abrasive particles 42 may be comprised of any suitable abrasive, such as $Al_2O_3$, SiC or WC. The module may be rotated beneath a nozzle of the grit blasting device, the nozzle being linearly translated above the surface being abraded.

13 Claims, 2 Drawing Sheets

SEMICONDUCTOR DEVICE HAVING METALLIC INTERCONNECTS FORMED BY GRIT BLASTING

This application is a continuation of Ser. No. 07/422,605 filed on Oct. 17, 1989 now abandoned which is a divisional of Ser. No. 07/207,085 filed on Jun. 15, 1988 now U.S. Pat. No. 4,896,464.

TECHNICAL FIELD OF THE INVENTION

This invention relates generally to integrated circuit packages and, in particular, to a method of forming upstanding metallic interconnects upon a ceramic package by grit blasting a surface of the package such that terminal portions of metallic vias are exposed by abrading away the surrounding ceramic material and to a ceramic integrated circuit package so formed.

BACKGROUND OF THE INVENTION

A particularly effective integrated circuit package is achieved by multilayer ceramic (MLC) technology. In general, the package is comprised of a plurality of layers of ceramic material which are laminated together and subsequently fired to sinter the layers into a unitary ceramic "brick". Upon a top surface of the brick are mounted one or more integrated circuit die. The opposite surface of the brick is provided with a plurality of protruding electrical terminals for coupling the package to, for example, an electronic circuit board.

Typically, each of the layers is first provided in a "greensheet" form, that is, as an unfired polymer binder which may have a desired quantity of ground glass material distributed throughout. Holes are made through the layers, typically by a punching process; each hole defining the desired location of a conductive via. The holes are thereafter filled with a paste which comprises conductive metal particles, such as molybdenum. If desired, conductive pathways may also be formed between some of the vias by applying the metallic paste in a desired configuration by well known screening operations. A plurality of greensheets are thereafter laminated together to form a multilayered structure. Some of the vias of adjacent greensheet layers are typically formed in registration with one another for producing continuous vias which extend from one surface of the structure to the opposite surface.

After forming the multilayer structure in the manner described above the structure is baked by a, typically, two step process. During a first step the structure is baked at a first temperature such that any organic material within the structure is burned away. Thereafter, the structure is baked at a second, higher temperature such that the laminated greensheet layers are sintered into a multilayered ceramic brick. During this baking process the metal paste is cured such that solid metallic interconnections are formed through the via holes and between selected vias. One or more integrated circuit die are then typically bonded to a top surface of the brick. The opposite, bottom surface of the brick is thereafter provided with protruding electrical conductors for subsequently coupling the resulting ceramic package, or module, to a carrier such as a printed circuit board.

Conventional methods of providing the protruding electrical conductors involve a brazing operation whereby electrically conductive pins or studs are brazed to pads electrically connected to the vias which have an end which extends to a surface of the module. This subsequent brazing operation has been found to be costly. Also, due to the required physical joining of the pin to the via end surface, such a pin brazing technique may introduce a mechanical reliability problem.

It is therefore one object of the invention to provide a multilayered ceramic body having one or more conductors disposed within, certain of the conductors having an integral end portion protruding in an upstanding manner above a surface of the body.

It is another object of the invention to provide a method of forming metallic pins or studs upon a surface of a ceramic structure.

It is a further object of the invention to provide a method of forming metallic pins or studs upon the bottom surface of a ceramic integrated circuit module which eliminates the conventional method of brazing the pins or studs to exposed ends of metallic vias.

It is a still further object of the invention to provide a method of forming metallic pins or studs upon the bottom surface a ceramic integrated circuit module by abrading the bottom surface selectively such that terminal portions of metallic vias are left exposed in a protruding, upstanding fashion above the bottom surface.

It is one still further object of the invention to provide a method of forming metallic pins or studs upon a surface of a ceramic integrated circuit module by abrading the surface selectively such that terminal portions of metallic vias are left exposed in a protruding fashion above the surface, the surface being abraded by a stream of abrasive particles which are directed against the surface.

Another object of the invention to provide a method of forming metallic pins or studs upon a surface of a ceramic integrated circuit module by abrading the surface selectively such that terminal portions of metallic vias are left exposed in a protruding fashion above the surface, the surface being abraded by a stream of abrasive particles which are directed against the surface, the surface being rotated beneath a grit blasting nozzle which is linearly translated above the surface.

SUMMARY OF THE INVENTION

The foregoing problems are overcome and the objects of the invention are realized by a method of the invention of forming upstanding conductive terminals upon a surface of a ceramic structure. The method is disclosed to comprise the steps of providing a ceramic structure having at least one metallic member contained within the structure, the member having a terminal portion proximally disposed to a surface of the ceramic structure; directing a stream of abrasive particles at the surface of the ceramic structure; and abrading with the stream of abrasive particles the surface of the ceramic structure such that the metallic member is left protruding from the abraded surface.

In accordance with another method of the invention there is disclosed a method of forming a plurality of electrically conductive upstanding pins upon a surface of a ceramic multilayered module. This second method is disclosed to comprise the steps of providing a multilayered ceramic module having a plurality of internally disposed elongated metallic conductors, each of which is orientated in a substantially perpendicular manner to a surface of the module; directing a stream of abrasive grit against the surface of the module; and selectively abrading away the surface of the module such that terminal portions of the metallic conductors are exposed in an upstanding manner relative to the abraded surface of the module. The module may be rotated beneath the stream of abrasive grit which is directed from a nozzle which is linearly translated above the surface.

Further in accordance with the invention there is disclosed a ceramic structure comprising a body comprised of a plurality of layers of ceramic material; and at least one conductor embedded within the body, at least one embedded conductor having at least one extension which projects above an outer surface of the body, the projecting extension being unitary with a portion of the conductor embedded within the body.

BRIEF DESCRIPTION OF THE DRAWING

These and other aspects of the invention will be made more apparent in the ensuing Description of the Preferred Embodiments being read in conjunction with the accompanying Drawing, wherein:

FIG. 3b is a top view of the module, jig and nozzle of FIG. 3a.

DESCRIPTION OF THE PREFERRED EMBODIMENTS

Figure 1:
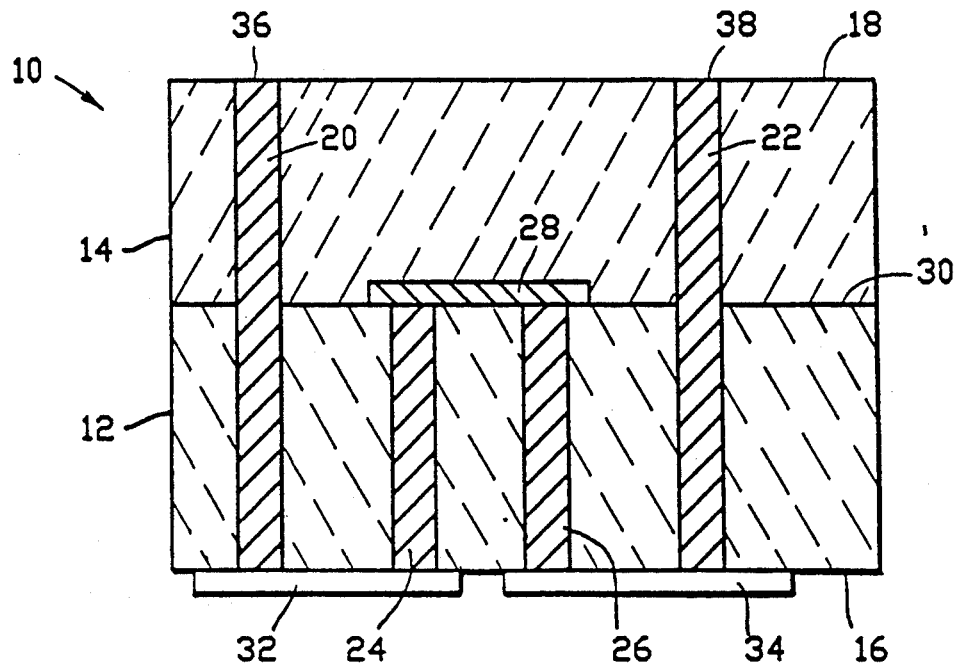
FIG. 1 is a cross sectional view of an exemplary multilayer ceramic integrated circuit module prior to selectively abrading the bottom surface.

Referring now to FIG. 1 there is shown an exemplary multilayer ceramic module 10 having a first layer 12 and a second layer 14. Layers 12 and 14 are comprised of ceramic material as has been previously described. For example, layers 12 and 14 may be comprised of alumina ($Al_2O_3$) which have been sintered at a temperature of approximately 1500° C. Extending from a first surface 16 to a second surface 18 of the module 10 are a plurality of metallic conductors 20 and 22. A plurality of other conductors 24 and 26 may be provided which extend only partially through the module 10. As shown, conductors 24 and 26 extend only through the layer 12 and are conductively coupled together by a metallic pathway or trace 28 which is provided upon a surface 30 of the layer 12. Conductors 20-26 and trace 28 are fabricated as previously described and may comprise molybdenum, silver, gold, copper, nickel or any suitable electrically conductive material. Disposed upon the first surface 16 of module 10 are a plurality of integrated circuit die 32 and 34. The die 32 and 34 typically comprise input/output terminals (not shown) which are electrically coupled, such as by soldering, to selected ones of the conductors 20-26. Thus, the die 32 and 34 are electrically coupled through the module 10 to the second surface 18 by vias 20 and 22 and are also electrically coupled together by the vias 24 and 26 through the trace 28.

It should be realized that the multilayer module 10 shown in FIG. 1 is not drawn to scale and may have a total thickness of one centimeter or less. Thus, the view of FIG. 1 is illustrative only. Furthermore, the module 10 may comprise far more than two layers and two integrated circuit die. It should further be realized that a large number of integrated circuit die may be conductively coupled together in a dense and highly integrated manner for forming, for example, components of a digital computer system. A plurality of such modules 10 may thereafter be coupled together by a common substrate, such as a printed circuit board comprised of a conventional glass epoxy material or substrate comprised of multilayered ceramic material. Inasmuch as the terms "ceramic" and "glass-ceramic" are often used interchangeably in the art, the term "ceramic" as used herein should be understood to include "glass-ceramic".

In order to couple the multilayer module 10 to a substrate the ends 36 and 38 of conductors 20 and 22, respectively, were conventionally further processed such that a conductive pin or stud was brazed to the exposed end. The aforedescribed problems associated with such brazing include additional cost and complexity.

Figure 2:
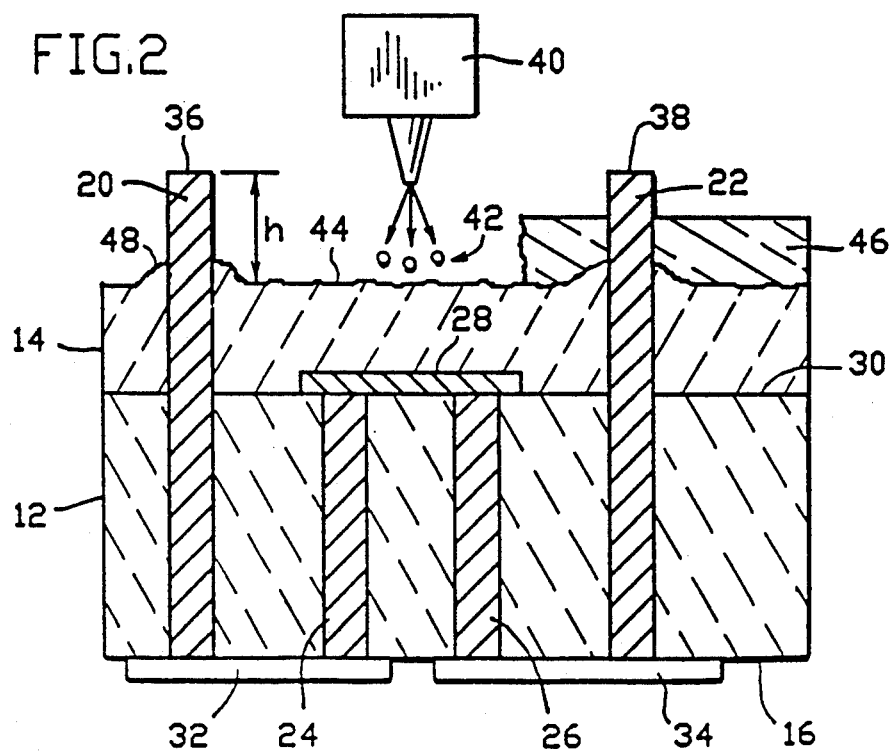
FIG. 2 is a cross sectional view of the ceramic package of FIG. 1 showing the bottom surface, in accordance with the method of the invention, being abraded by a stream of abrasive particles such that terminal portions of the metallic vias are left protruding above the bottom surface.

Referring now to FIG. 2 there is illustrated, in accordance with the invention, the formation of protruding electrically conducting pins by the selective abrasion of the surface 18. As can be seen, an abrasive blasting device 40 is disposed adjacent to the surface 18 for directing a stream of abrasive particles 42 against It is one still further object of the invention to the surface. The particles 42 strike both the metallic conductors 20 and 22 and also the ceramic material of the layer 14. Inasmuch as the ceramic material is relatively hard and brittle as compared to the ductile metallic conductors the abrasive particles 42 abrade away the ceramic layer 14 at a faster rate than the ductile metallic material of the conductors 20 and 22. Due to a "shadowing" effect caused by the conductor it has been observed that a small collar 48 of ceramic material may be formed about the base of the conductor. The abrasive particles 42 may be comprised of any suitable abrasive, such as aluminum oxide ($Al_2O_3$), silicon carbide (SiC) or tungsten carbide (WC).

The method of the invention produces free standing metallic conductors that protrude outward from a roughened ceramic surface 44. It has been found that one or more sacrificial greensheet layers, such as the layer 14, provided upon the surface of the module may facilitate the formation of the upstanding metallic conductors.

By way of example, a fully fired alumina MLC module was blasted with #240 grit silicon carbide (SiC) from a grit hand held blasting device running at 50 psi for 20 to 200 seconds. The blasting device was positioned approximately 3 inches from the surface. Free standing molybdenum conductors were produced having a height (h) of between 0.5 mils to 5.0 mils. Subsequent examination of the surface by both light and scanning electron microscopy showed that the selective removal of the ceramic material occurred without excessive degradation of the molybdenum conductors. The resulting conductors were suitable for coupling the module to a substrate in a substantially identical manner as were terminals formed by conventional brazing techniques.

Due to the possibility of shrinkage of the metallic paste during firing, the ends (36, 38) of some of the conductors (20, 22) may be recessed below the surface 18. If desired, the surface 18 may be ground in order to substantially equalize the lengths of the conductors before the surface 18 is abraded.

It can be appreciated that the roughened surface 44 of the module is also advantageous when it is desired to further process the module by performing bottom surface metalization techniques and/or to backfill the surface with a layer (shown in partial cross section as the layer 46) of dielectric material. One suitable dielectric material may be a layer comprised of polyimide.

Figure 3A:
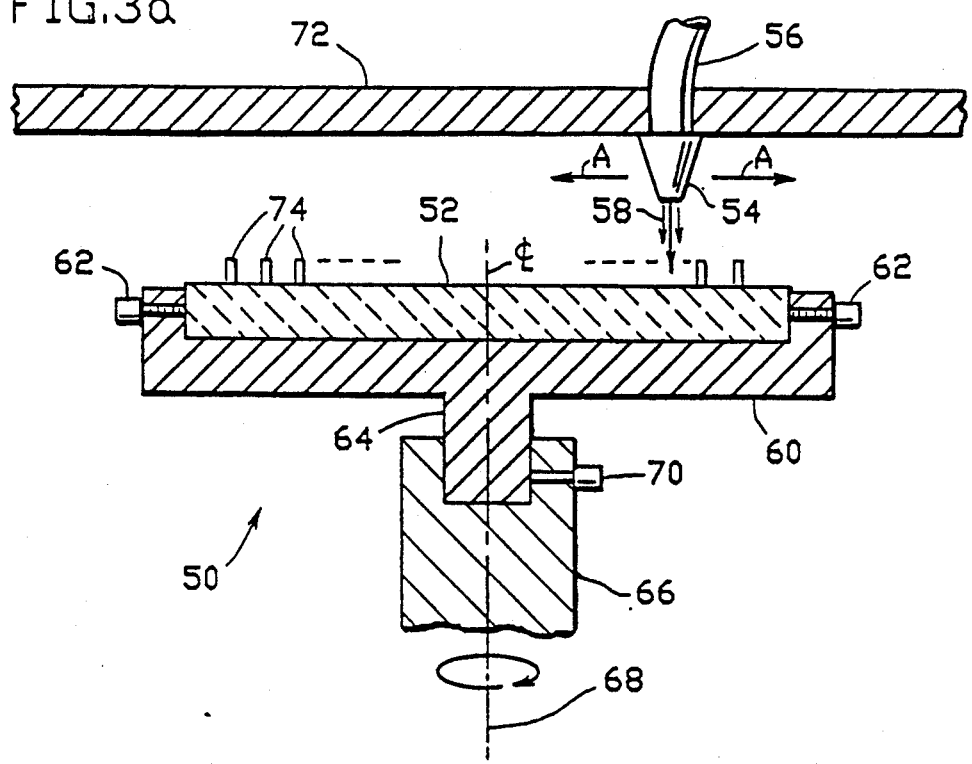
FIG. 3a is a side cut away view, not necessarily to scale, of a ceramic module held by a rotating jig beneath a linearly translated grit blasting nozzle.
Figure 3B:
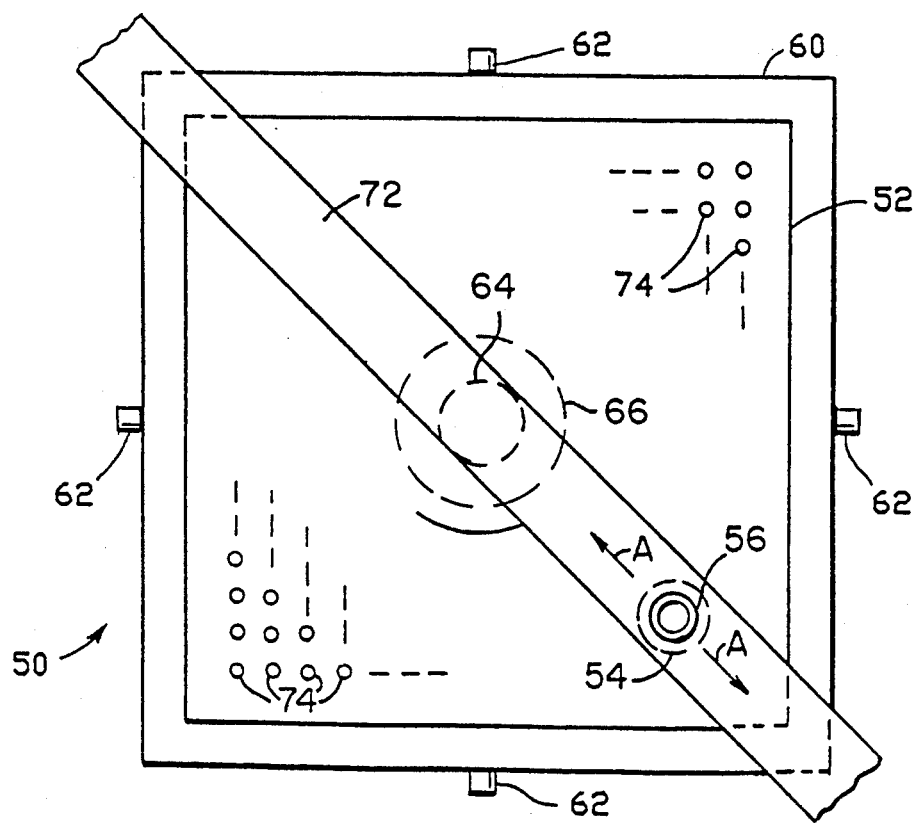

Referring now to FIGS. 3a and 3b there is shown a cut-away side view and a top view, respectively, of apparatus useful for practicing another method of the invention. The apparatus of FIG. 3 enables the fabrication of upstanding conductive studs of substantially uniform height and geometry over a large area of a ceramic substrate.

Specifically, the apparatus includes cooperating structures 50 for rotating a ceramic substrate 52 beneath a transversely moved nozzle 54 of a grit blasting device, the nozzle 54 being coupled to a hose 56 or other suitable conduit for delivering grit particles 58 to the nozzle.

A fixture 60, which may comprise aluminum, securely holds the substrate 52. Fixture 60 may have a recess made within a top surface thereof, the recess having a shape to accommodate the shape of the substrate 52. A plurality of grub screws 62 may also be provided through the sides of the fixture 60 for securely engaging the sides of the substrate 52.

Fixture 60 may further be provided with a coupler, such as a boss 64, for being coupled to a rotating chuck 66 or other rotating device such that the fixture 60 and substrate 52 are rotated about a rotational axis 68. A set screw 70 may be provided for firmly engaging the boss 64.

A transverse arm 72 upon which is mounted the nozzle 54 is disposed above the fixture 60 such that, preferably, nozzle 54 may be linearly translated, in the directions indicated by the arrows A, over the surface of the substrate 52 and through the rotational axis 68. Arm 72 may be driven by a linear actuator (not shown) or other apparatus, such as an X-Y positioning device, such that the linear velocity of the nozzle 54 may be varied during the translation thereof. Preferably, the linear velocity of the nozzle 54 is decreased as the nozzle 54 approaches the rotational axis 68 and is increased as the nozzle 54 recedes from the axis 68. Thus, due to the increase in angular velocity of points on the surface of substrate 52 as a function of distance from the axis 68, the linear velocity of nozzle 54 is continuously adjusted to compensate for the variable rotational velocity, resulting in a substantially constant velocity of the nozzle 54 relative to points on the surface of substrate 52. This relative constant velocity results in a desirable substantially constant rate of abrasion of the surface of the substrate 52 which yields protruding conductors 74 of substantially uniform height and shape.

It has been found that for a given rotation of the substrate 52 within a range of approximately 50 and 300 R.P.M. that a variable linear velocity of arm 72 and attached nozzle 54 within a range of approximately six inches per minute to 45 feet per minute results in a substantially uniform abrasion of the substrate 52 surface. The substrate 52 may be substantially square shaped as shown and have linear dimensions of about six inches along each edge. The working distance between the tip of nozzle 54 and the surface of substrate may, by example, be within a range of approximately one to four inches. The nozzle 54 is preferably maintained at substantially a 90° orientation to the surface of the substrate but the angular orientation may be set at some other angle to achieve a desired geometry of the protruding conductors.

If desired, the linear velocity of the arm 72 and nozzle 54 may be fixed and the rotational rate of the substrate 52 may be varied as a function of the position of the nozzle relative to the axis of rotation 68. For example, if the substrate 52 is rotated by a stepper motor the number of step pulses applied to the motor may be varied over time such that the RPM of the substrate 52 is increased as the nozzle approaches the axis of rotation 68.

Also if desired two or more sizes of abrasive particles may be employed. A coarser grit, for example 60 to 70 microns in diameter, may be first used to abrade the surface to approximately a desired height of the terminals. A finer grit, for example 12 to 20 microns in diameter, may then be used to finish the surface. This second, finer grit abrasion may improve the microshear characteristics of the surface with a subsequent improvement in adhesion of subsequently applied material.

The method of the invention provides a one step selective process for producing in a controlled and rapid manner upstanding pins of various heights by eliminating the need for conventional bottom surface metallizing techniques and conventional pin brazing techniques. Any layers applied to the surface after grit blasting the surface experience an increase of adhesion due to the roughened substrate surface. Another significant advantage made possible by the method of the invention is that the MLC module may be electrically tested, through the upstanding pins, prior to subsequent integrated circuit die interconnection processing steps, thereby increasing yield and reducing the cost associated with each module.

The invention further provides a method of fabricating a multilayered ceramic module which comprises the steps of providing a plurality of layers of greensheet material; making a plurality of openings through each of the sheets of greensheet material, selected ones of the openings defining a desired position of a conductive via through each of the layers; filling the openings with an electrically conductive material; laminating the sheets of greensheet material together to form a multilayered structure, certain of the openings in adjacent sheets of greensheet material being in registration one with another for defining conductive vias which extend through a plurality of layers, at least some of the conductive vias which extend through a plurality of layers extending to an outer surface of the multilayered structure; baking the multilayered structure such that the greensheet layers are sintered into a multilayered ceramic module, the step of baking also converting the conductive material within certain of the openings into continuous conductors which extend through a plurality of layers of the module, at least some of the conductors extending to an outer surface of the module; and abrading away at least a portion of the outer surface of the module such that terminal portions of the conductors protrude in an upstanding fashion above the abraded surface.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A structure comprising:

a body comprised of a plurality of layers of ceramic material, said ceramic material being erodable by a flow of abrasive material; and at least one electrical conductor comprised of a material that withstands the flow of abrasive material, said at least one electrical conductor being embedded within said body, said at least one electrical conductor having at least one extension which projects above an outer surface of said body after said outer surface has been eroded by the flow of abrasive material, said projecting extension being unitary with a portion of said electrical conductor embedded within said body, said embedded portion passing through a plurality of said layers of ceramic material.

2. The structure of claim 1, wherein said electrical conductor is comprised of a ductile metal.

3. The structure of claim 2, wherein said metal includes metals selected from the group consisting of molybdenum, gold, silver, copper, nickel and combinations thereof.

4. The structure of claim 1 and further comprising a layer of dielectric material disposed upon the outer surface.

5. The structure of claim 4 wherein the layer of dielectric material comprises polyimide.

6. The structure of claim 1 wherein the ceramic material is comprised of alumina.

7. The structure of claim 4 wherein the layer of dielectric material has a thickness that is less than a height of the projecting extension of the electrical conductor.

8. A structure comprising:

a body comprised of a plurality of layers of sintered ceramic material; and a plurality of elongated electrical conductors embedded within the body each having an extension projecting perpendicularly outward from an abraded surface of the body, each projecting extension being unitary with a portion of the electrical conductor embedded within the body, the embedded portion passing perpendicularly through a plurality of the layers of ceramic material.

9. The structure of claim 8, wherein the electrical conductors are comprised of a metal selected from the group consisting of molybdenum, gold, silver, copper, nickel and combinations thereof.

10. The structure of claim 8 and further comprising a layer of dielectric material disposed upon the abraded surface and having a thickness that is less than a height of the projecting extension of the electrical conductors.

11. The structure of claim 10 wherein the layer of dielectric material comprises polyimide.

12. The structure of claim 8 wherein each of the plurality of layers is comprised of alumina.

13. The structure of claim 8 wherein at least one of the electrical conductors is electrically coupled to an electrical terminal of an integrated circuit device.

* * * * *